(12) United States Patent
Wang (10) Patent No.: US 12,361,856 B2
(45) Date of Patent: Jul. 15, 2025

(54) SHIFT REGISTER, CONTROL METHOD THEREOF, LIGHT-EMITTING CONTROL CIRCUIT, AND DISPLAY DEVICE

(71) Applicant: BOE Technology Group Co., Ltd., Beijing (CN)

(72) Inventor: Zhichong Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 171 days.

(21) Appl. No.: 18/273,771

(22) PCT Filed: Oct. 22, 2021

(86) PCT No.: PCT/CN2021/125821
§ 371 (c)(1),
(2) Date: Jul. 23, 2023

(87) PCT Pub. No.: WO2022/166262
PCT Pub. Date: Aug. 11, 2022

(65) Prior Publication Data
US 2024/0087498 A1    Mar. 14, 2024

(30) Foreign Application Priority Data
Feb. 8, 2021   (CN) .......................... 202110172552.0

(51) Int. Cl.
*G09G 3/20*         (2006.01)
*G09G 3/3266*       (2016.01)
*G11C 19/28*        (2006.01)

(52) U.S. Cl.
CPC ......... *G09G 3/2092* (2013.01); *G09G 3/3266* (2013.01); *G09G 2310/0286* (2013.01); *G09G 2310/08* (2013.01); *G11C 19/28* (2013.01)

(58) Field of Classification Search
CPC .............. G09G 3/2092; G09G 3/3266; G09G 2310/0286; G09G 2310/08; G11C 19/28
See application file for complete search history.

(56) References Cited

U.S. PATENT DOCUMENTS

2016/0019833 A1    1/2016  Wei et al.
2018/0075923 A1 *  3/2018  Ma ......................... G11C 19/28

FOREIGN PATENT DOCUMENTS

CN          104157236 A      11/2014
CN          105702295 A       6/2016
(Continued)

OTHER PUBLICATIONS

PCT/CN2021/125821 international search report.

*Primary Examiner* — Priyank J Shah
(74) *Attorney, Agent, or Firm* — IPro, PLLC (57) ABSTRACT

A shift register, a control method thereof, a light-emitting control circuit, and a display device are provided. The shift register includes: an input module, a first node, a second node, a first control module, a second control module, a third node, a light-emitting signal output module, and a gate control module. The input module is configured to receive an input signal and control potentials of the first node and the second node. The first control module is configured to control the potential of the second node based on the potential of the first node. The second control module is configured to control potentials of the first node and the third node and to control the gate control module to output a gate control signal. The light-emitting signal output module is configured to output a light-emitting control signal based on the potential of the second node or the third node.

20 Claims, 5 Drawing Sheets

(56) References Cited

FOREIGN PATENT DOCUMENTS

| CN | 106847159 A | 6/2017 |
|----|-------------|--------|
| CN | 112951307 A | 6/2021 |

* cited by examiner

SHIFT REGISTER, CONTROL METHOD THEREOF, LIGHT-EMITTING CONTROL CIRCUIT, AND DISPLAY DEVICE

CROSS-REFERENCE TO RELATED APPLICATIONS

This application is a 371 of PCT Patent Application No. PCT/CN2021/125821, filed on Oct. 22, 2021, which claims priority to Chinese Patent Application No. 202110172552.0, filed on Feb. 8, 2021, the entire contents of both of which are incorporated herein by reference.

TECHNICAL FIELD

The present application relates to the field of display technologies, in particular to a shift register, a control method thereof, a light-emitting control circuit, and a display device.

BACKGROUND OF THE INVENTION

Generally, two sets of GOA outputs are required in driving solutions of the existing PMOS OLED internal compensation pixel circuit, which are EM GOA and Gate GOA. The EM GOA herein is configured to provide N-type output for outputting light-emitting signals, and the Gate GOA is configured to provide P-type output for outputting gate signals. However, providing two sets of GOA units may cause left and right bezels of the display panel to be rather wide, and a rather complex driving circuit process is required to achieve intelligent and low-power-consumption display. Therefore, how to simplify the process of the driving circuit and meanwhile ensure the provision of both N-type and P-type outputs has become a pressing problem.

SUMMARY OF THE INVENTION

The present application provides a shift register, a control method thereof, a light-emitting control circuit and a display device.

The shift register according to embodiments of the present application includes an input module, a first node, a second node, a first control module, a second control module, a third node, a light-emitting signal output module, and a gate control module, wherein
 the input module is connected to the first node and the second node, and is configured to receive an input signal and control potentials of the first node and the second node;
 the first control module is connected to the first node and the second node, and is configured to control the potential of the second node based on the potential of the first node;
 the second control module is connected to the first node, the third node and the gate control module, and is configured to control potentials of the first node and the third node and control the gate control module to output a gate control signal; and
 the light-emitting signal output module is connected to the second node and the third node, and is configured to output a light-emitting control signal based on the potential of the second node or the third node.

In some embodiments, the shift register is connected to a signal input terminal, and the gate control module includes a first sub-gate control module, a second sub-gate control module and a first output terminal;

the first sub-gate control module is connected to a first potential terminal, the signal input terminal and the first output terminal, and is configured to transmit a first potential of the first potential terminal to the first output terminal based on an input signal transmitted by the signal input terminal; and
 the second sub-gate control module is connected to the second control module, a first clock signal terminal and the first output terminal, and is configured to transmit a first clock signal of the first clock signal terminal to the first output terminal based on a potential input by the second control module.

In some embodiments, the first sub-gate control module includes a first output control transistor, a first output transistor, and a first storage capacitor, wherein
 a first electrode of the first output control transistor is connected to the first potential terminal, a second electrode of the first output control transistor is connected to the first storage capacitor, and a gate of the first output control transistor is connected to the signal input terminal;
 a first electrode of the first output transistor is connected to the first potential terminal, a second electrode of the first output transistor is connected to the first output terminal, and a gate of the first output control transistor is connected to the signal input terminal;
 for the first storage capacitor, a first terminal of the first storage capacitor is connected to the second electrode of the first output control transistor, and a second terminal of the first storage capacitor is connected to the first output terminal.

In some embodiments, the second sub-gate control module includes a second output control transistor and a second output transistor, wherein
 both a first electrode and a gate of the second output control transistor are connected to the second control module, and a second electrode of the second output control transistor is connected to the first storage capacitor and the second output transistor; and
 a first electrode of the second output transistor is connected to the first clock signal terminal, a second electrode of the second output transistor is connected to the first output terminal, and a gate of the first output transistor is connected to the second electrode of the second output control transistor.

In some embodiments, the light-emitting signal output module includes a third output transistor, a fourth output transistor and a second output terminal, wherein
 a first electrode of the third output transistor is connected to a second potential terminal, a second electrode of the third output transistor is connected to the second output terminal, and a gate of the third output transistor is connected to the second node; and
 a first electrode of the fourth output transistor is connected to a first potential terminal, a second electrode of the fourth output transistor is connected to the second output terminal, and a gate of the fourth output transistor is connected to the third node.

In some embodiments, the shift register is connected to a signal input terminal, and the input module includes a first transistor, a second transistor and a third transistor, wherein
 a first electrode of the first transistor is connected to the signal input terminal, a second electrode of the first transistor is connected to the second node, and a gate of the first transistor is connected to a first clock signal terminal;

a first electrode of the second transistor is connected to a second potential terminal, a second electrode of the second transistor is connected to the first node, and a gate of the second transistor is connected to the first clock signal terminal; and a first electrode of the third transistor is connected to a first clock signal, a second electrode of the third transistor is connected to the first node, and a gate of the third transistor is connected to the second node.

In some embodiments, the input module further includes:

a second storage capacitor, wherein a first terminal of the second storage capacitor is connected to a second clock signal terminal, and a second terminal of the second storage capacitor is connected to the second node.

In some embodiments, the first control module includes a fourth transistor and a fifth transistor;

a first electrode of the fourth transistor is connected to a first potential terminal, a second electrode of the fourth transistor is connected to the fifth transistor, and a gate of the fourth transistor is connected to the first node; and a first electrode of the fifth transistor is connected to the second electrode of the fourth transistor, a second electrode of the fifth transistor is connected to the second node, and a gate of the fifth transistor is connected to a second clock signal terminal.

In some embodiments, the shift register further includes a fifth node and a sixth node, and the first control module includes a fourth transistor, a fifth transistor and a second storage capacitor, wherein a first electrode of the fourth transistor is connected to a first potential terminal, a second electrode of the fourth transistor is connected to the second storage capacitor, and a gate of the fourth transistor is connected to the fifth node;

a first electrode of the fifth transistor is connected to the second clock signal terminal, a second electrode of the fifth transistor is connected to the second storage capacitor, and a gate of the fifth transistor is connected to the second node; and a first terminal of the second storage capacitor is connected to the second electrode of the fourth transistor and the second electrode of the fifth transistor, and a second terminal of the second storage capacitor is connected to the second node.

In some embodiments, the shift register further includes an isolation module, and the isolation module includes a first isolation transistor for isolating the first node from the fifth node and a second isolation transistor for isolating the second node from the sixth node;

a first electrode of the first isolation transistor is connected to the fifth node, a second electrode of the first isolation transistor is connected to the first node, and a gate of the first isolation transistor is connected to a second potential terminal; and a first electrode of the second isolation transistor is connected to the sixth node, a second electrode of the first isolation transistor is connected to the second node, and a gate of the second isolation transistor is connected to the second potential terminal.

In some embodiments, the second control module includes a sixth transistor, a seventh transistor, an eighth transistor, a third storage capacitor, a fourth storage capacitor and a fourth node, wherein a first electrode of the sixth transistor is connected to a second clock signal terminal, a second electrode of the sixth transistor is connected to the fourth node, and a gate of the sixth transistor is connected to the first node;

a first electrode of the seventh transistor is connected to the fourth node, a second electrode of the seventh transistor is connected to the third node, and a gate of the seventh transistor is connected to the second clock signal terminal;

a first electrode of the eighth transistor is connected to the first potential terminal, a second electrode of the eighth transistor is connected to the third node, and a gate of the eighth transistor is connected to the second node;

a first terminal of the third storage capacitor is connected to the third node, and a second terminal of the third storage capacitor is connected to the first potential terminal; and a first terminal of the fourth storage capacitor is connected to the first node, and a second terminal of the fourth storage capacitor is connected to the fourth node.

A light-emitting control circuit for a shift register according to the present application includes the shift register according to any one of aforesaid aspects.

A display device according to embodiments of the present application includes a pixel driving circuit and a light-emitting control circuit as described above.

In some embodiments, the pixel driving circuit is connected to the shift register according to any one of aforesaid aspects and includes a light-emitting signal input terminal and a gate signal input terminal; the light-emitting signal input terminal is connected to the light-emitting signal output module, and the gate signal input terminal is connected to the gate control module; and the light-emitting signal input terminal is configured to receive the light-emitting control signal output by the light-emitting signal output module, and the gate signal input terminal is configured to receive the gate control signal output by the gate signal output module.

Additional aspects and advantages of the present application will be partially given in the following description, and some will become apparent from the following description or will be learned through the practice of the present application.

BRIEF DESCRIPTION OF DRAWINGS

The foregoing and/or additional aspects and advantages of the present application will become apparent and readily understood from the description of the embodiments with reference to following accompanying drawings.

REFERENCE SIGNS OF MAIN COMPONENTS

Input module 11, First transistor M1, Second transistor M2, Third transistor M3, Second storage capacitor C2;

First control module 12, Fourth transistor M4, Fifth transistor M5;
Second control module 13, Sixth transistor M6, Seventh transistor M7, Eighth transistor M8, Third storage capacitor C3, Fourth storage capacitor C4;
Light-emitting signal output module 14, Third output transistor M10, Fourth output transistor M9, Second output terminal Out2;
Gate control module 15, First sub-gate control module 152, First output control transistor M12, First output transistor M14, First storage capacitor C1, Second sub-gate control module 154, Second output control transistor M13, Second output transistor M11, First output terminal Out1;
Isolation module 16, First isolation transistor M15, Second isolation transistor M16; First node P1, Second node P2, Third node P3, Fourth node P4, Fifth node P5, Sixth node P6;
Signal input terminal IN, Input signal Input, First potential terminal VGH, First potential Vgh, Second potential terminal VGL, Second potential Vgl, First clock signal terminal CLK, First clock signal clk, Second clock signal terminal CLKB, Second clock signal clkb;
Shift register 10, Light-emitting control circuit 100, Gate driving circuit 200, Display device 1000.

DETAILED DESCRIPTION

The following describes the embodiments of the present application in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present application, but should not be understood as limiting the same.

In the description of the present application, it should be understood that, orientation or position relationships indicated by the terms "center", "longitudinal", "transversal", "length", "width", "thickness", "above", "below", "front", "back", "left", "right", "vertical", "horizontal", "top", "bottom", "inner", "outer", "clockwise", "counterclockwise" or the like are based on the orientation or position relationships as shown in the drawings, which are merely for ease of the description of the present application and simplifying the description rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance or implicitly indicating the number of the indicated technical features. Hence, the features defined by "first" and "second" may explicitly or implicitly include one or more of the features. In the description of the present application, "a plurality of" refers to two or more in number, unless otherwise specifically defined.

In the description of the present application, it should be understood that, unless otherwise specified and defined, the terms "install", "connected with" and "connected to" should be comprehended in a broad sense. For example, these terms may be comprehended as that the components are connected fixedly, detachably or integrally, or connected mechanically, electrically or in a communication manner, or connected directly or indirectly via an intermediate medium, or connected by internal communication between two elements or interaction relationship between two elements. The specific meanings about the foregoing terms in the present application may be understood by those skilled in the art according to specific circumstances.

In the present application, unless otherwise specified and defined, the expression that a first feature is "above" or "below" a second feature may include a meaning that the first and second features are in direct contact, and may further include a meaning that the first and second features are not in direct contact but in contact via another feature between them. Moreover, the expression that the first feature is "on", "over" and "above" the second feature may include a meaning that the first feature is directly above and obliquely above the second feature, or simply means that the first feature is higher than the second feature in a horizontal direction. The expression that the first feature is "under", "below" and "underneath" the second feature may include a meaning that the first feature is directly below and obliquely below the second feature, or simply means that the first feature is lower than the second feature in a horizontal direction.

The following disclosure provides many different embodiments or examples for realizing different structures of the present application. In order to simplify the disclosure of the present application, the components and configurations of specific examples are described hereinafter. Of course, they are only examples and are not intended to limit the present application. In addition, reference numerals and/or reference letters may be repeated in different examples in the present application. Such repetition is for the purpose of simplification and clarity, and does not indicate the relationship between the various embodiments and/or configurations discussed. Furthermore, the present application provides examples of various specific processes and materials, but those of ordinary skill in the art may be aware of the application of other processes and/or the use of other materials.

In addition, it should be noted that the transistors in embodiments of the present application may be thin-film transistors or field-effect transistors or other switching devices with the same characteristics. Since the source and drain of the transistors as employed here are symmetrical in structure, there is no different between the source and the drain thereof. In embodiments of the present disclosure, in order to distinguish the two electrodes of the transistor other than the gate, one of the electrodes is directly described as the first electrode and the other as the second electrode, such that the source and drain of all or some of the transistors in embodiments of the present disclosure are interchangeable as needed.

In addition, the transistors may be divided into N-type and P-type transistors according to differences in the characteristics of the transistors. The P-type transistors are taken as an example to illustrate the embodiments of the present disclosure. That is, in the embodiment of the present application, when the gate of a transistor receives a low-level signal, the first and second electrodes of the transistor are turned on. Based on the description and teaching of implementations of the P-type transistor in the present disclosure, those of ordinary skill in the art, without any creative work, may readily envisage implementations of embodiments of the present disclosure adopting the N-type transistor. Therefore, these implementations also fall within the protection scope of the present disclosure.

Figure 1:
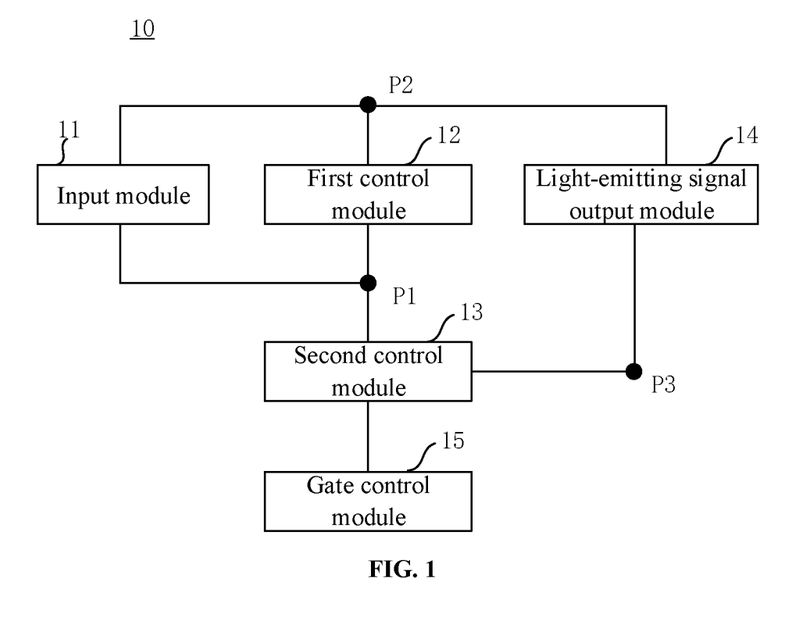
FIG. 1 is a schematic diagram of modules of a shift register according to embodiments of the present application.

With reference to FIG. 1, the present application provides a shift register 10. The shift register 10 includes: an input module 11, a first node P1, a second node P2, a first control module 12, a second control module 13, a third node P3, a gate control module 15 and a light-emitting signal output module 14.

The input module 11 herein is connected to the first node P1 and the second node P2, and is configured to control potentials of the first node P1 and the second node P2. The first control module 12 is connected to the first node P1 and the second node P2, and is configured to control the potential of the second node P2 based on the potential of the first node P1. The second control module 13 is connected to the first node P1, the third node P3 and the gate control module 15, and is configured to control potentials of the first node P1 and the third node P3 and also to control the gate control module 15 to output a gate control signal. The light-emitting signal output module 14 is connected to the second node P2 and the third node P3, and is configured to output a light-emitting control signal based on the potential of the second node P2 or the third node P3.

In the shift register 10 according to the present application, the input module 11, the first node P1, the second node P2, the first control module 12, the second control module 13, the third node P3, the light-emitting signal output module 14 and the gate control module 15 are configured such that the light-emitting signal output module 14 can output the light-emitting control signal and the gate control module 15 can output the gate control signal after the input module 11 receives the input signal Input. As a result, the shift register 10 is able to provide two types of outputs, which simplifies the process of the driving circuit, reduces the costs, and helps to simplify the structure of the display panel, thereby allowing the display panel to achieve a narrow bezel design and enhancing the user experience.

Figure 3:
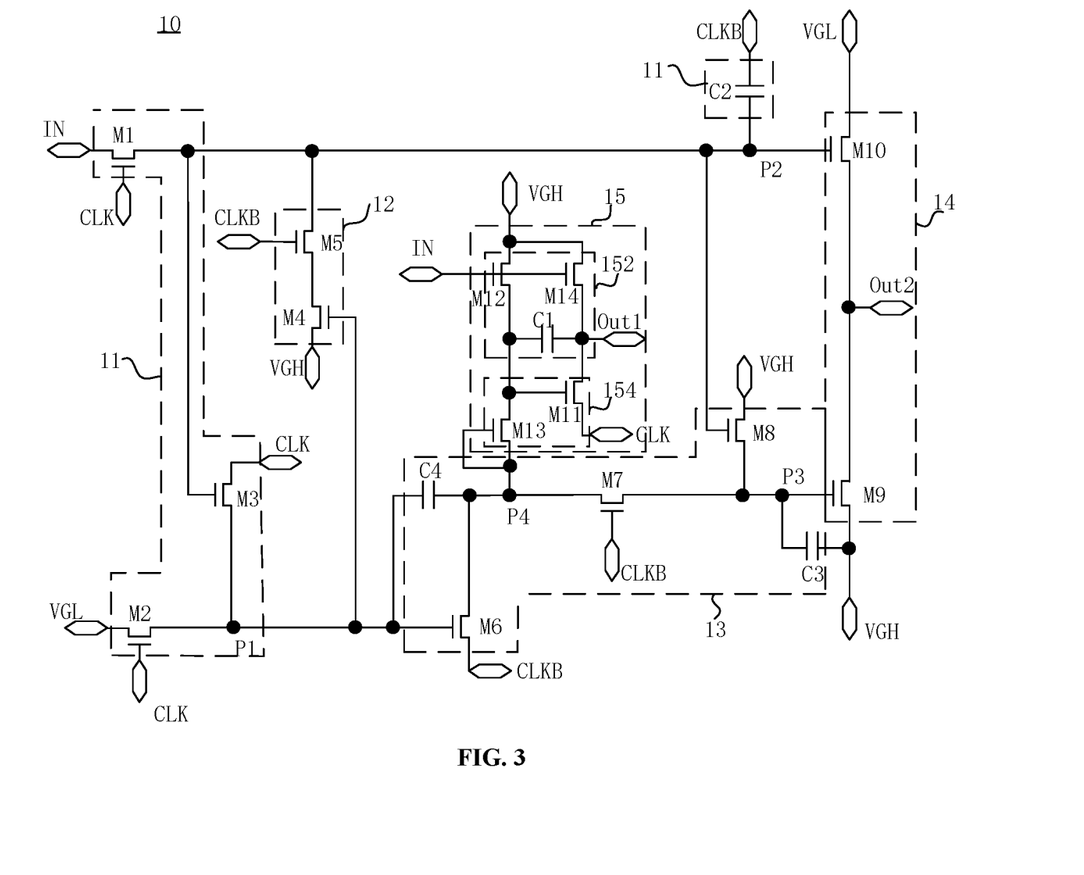
FIG. 3 is a schematic diagram of circuit connection for a shift register according to embodiments of the present application.
Figure 4:
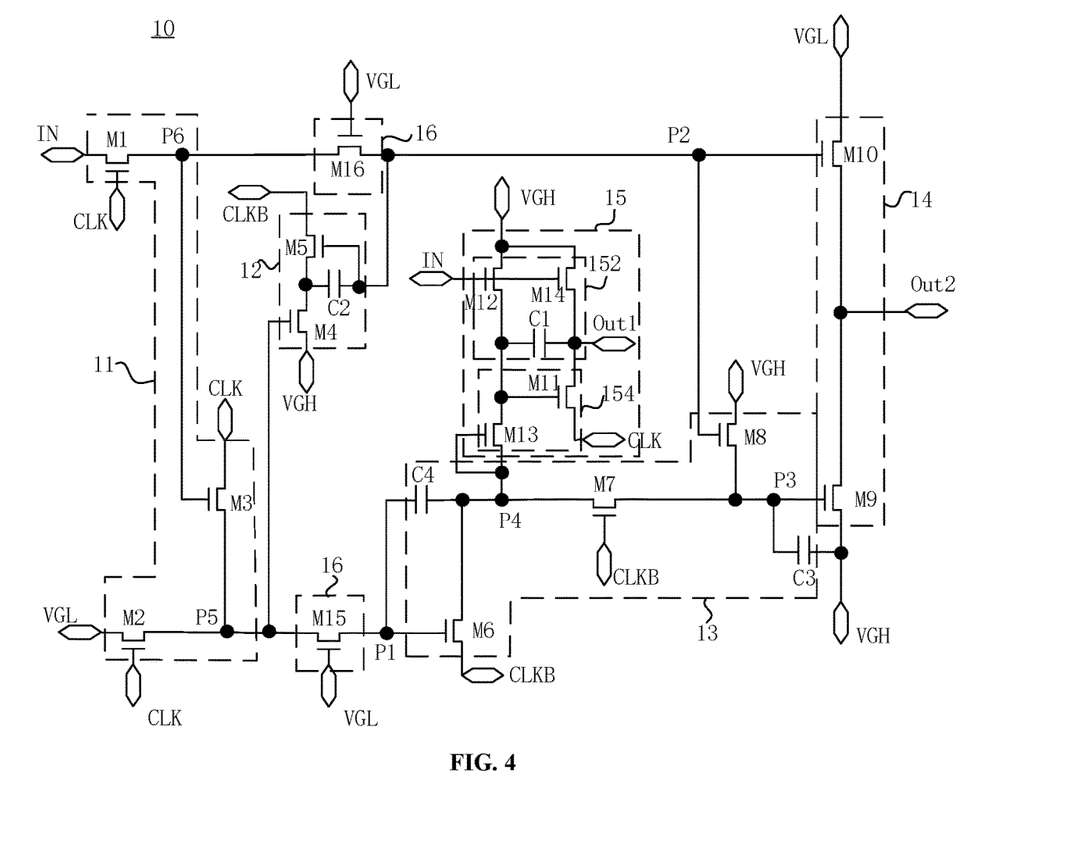
FIG. 4 is a schematic diagram of circuit connection for a shift register according to embodiments of the present application.

With reference to FIG. 3 or FIG. 4, specifically, the shift register 10 is connected to a first clock signal terminal CLK, a second clock signal terminal CLKB, a first potential terminal VGH, a second potential terminal VGL, a signal input terminal IN and a pixel driving circuit, respectively. The first clock signal terminal CLK is configured to transmit a first clock signal clk to the shift register 10; the second clock signal terminal CLKB is configured to transmit a second clock signal clkb to the shift register 10; and the signal input terminal IN is configured to transmit the input signal Input to the shift register 10. The first potential terminal VGH is configured to transmit a first potential Vgh to the shift register 10, and the second potential terminal VGL is configured to transmit a second potential Vgl to the shift register 10.

The first clock signal clk and the second clock signal clkb herein include a high-level signal and a low-level signal, and the first clock signal clk and the second clock signal clkb have the same cycle duration. In a clock cycle, the duration of the high-level signal is longer than that of the low-level signal. The input signal Input is a clock cycle that includes a high-level signal and a low-level signal, and the duration of the high-level signal of the input signal Input is longer than the clock cycle of the first clock signal clk or the second clock signal clkb. For example, the clock cycle is less than 3H when the duration of the high-level signal of the input signal Input is 3H. The first potential Vgh is in opposite phase with the second potential Vgl. For example, in the present application, the first potential Vgh is a high level, and the second potential Vgl is a low level.

Further, when the first clock signal clk and the second clock signal clkb are both high-level signals, their potentials may be same in size with the potential of the first voltage; and when the first clock signal clk and the second clock signal clkb are low-level signals, their potentials may be same in size with the potential of the second voltage. In addition, the potential of the high-level signal of the first clock signal clk may be equal in size to the potential of the first potential Vgh, and the potential of the low-level signal of the first clock signal clk may be equal in size to the potential of the second potential Vgl.

The shift register 10 includes the input module 11, the first control module 12, the second control module 13, the gate control module 15, the light-emitting signal output module 14, the first node P1, the second node P2, the third node P3 and a fourth node P4.

The input module 11 is connected to the first control module 12, the second control module 13 and the light-emitting signal output module 14 by accessing the first node P1 and the second node P2. The first control module 12 is connected to the light-emitting signal output module 14 and the second control module 13 by accessing the first node P1 and the second node P2. The second control module 13 is connected to the light-emitting signal output module 14 by accessing the third node P3, and to the gate control module 15 by accessing the fourth node P4.

In further conjunction with FIG. 3, the input module 11 includes a first transistor M1, a second transistor M2, a third transistor M3, and a second storage capacitor C2. Of course, in some embodiments, the input module 11 may not include the second storage capacitor C2 (as shown in FIG. 4).

The first electrode of the first transistor M1 herein is connected to the signal input terminal IN, the second electrode of the first transistor M1 is connected to the second node P2, and the gate of the first transistor M1 is connected to the first clock signal terminal CLK. The first transistor M1 is configured to transmit the input signal Input at the signal input terminal IN to the second node P2 based on the first clock signal clk of the first clock signal terminal CLK, so as to change the potential of the second node P2.

The first electrode of the second transistor M2 is connected to the second potential terminal VGL, the second electrode of the second transistor M2 is connected to the first node P1, and the gate of the second transistor M2 is connected to the first clock signal terminal CLK. The second transistor M2 is configured to transmit the first clock signal clk to the first node P1 based on the first clock signal terminal CLK.

The first electrode of the third transistor M3 is connected to the first clock signal terminal CLK, the second electrode of the third transistor M3 is connected to the first node P1, and the gate of the third transistor M3 is connected to the second node P2. The third transistor M3 is configured to transmit the first clock signal clk of the first clock signal terminal CLK to the first node P1 based on the potential of the second node P2.

The first terminal of the second storage capacitor C2 is connected to the second clock signal terminal CLKB, and the second terminal of the second storage capacitor C2 is connected to the second node P2 for compensating the potential of the second node P2.

In further conjunction with FIG. 3, in certain embodiments, the first control module 12 includes a fourth transistor M4 and a fifth transistor M5.

The first electrode of the fourth transistor M4 is connected to the first potential terminal VGH, the second electrode of the fourth transistor M4 is connected to the fifth transistor M5, and the gate of the fourth transistor M4 is connected to the first node P1. The fourth transistor M4 is configured to transmit the first potential Vgh of the first potential terminal VGH to the fifth transistor M5 based on the potential of the first node P1.

The first electrode of the fifth transistor M5 is connected to the second electrode of the fourth transistor M4, the second electrode of the fifth transistor M5 is connected to the second node P2, and the gate of the fifth transistor M5 is connected to the second clock signal terminal CLKB. The fifth transistor M5 is configured to write the first potential Vgh transmitted by the fourth transistor M4 to the second node P2 based on the second clock signal clkb at the second clock signal terminal CLKB.

In further conjunction with FIG. 4, in some other embodiments, the shift register 10 further includes a fifth node P5 and a sixth node P6, and the first control module 12 includes the fourth transistor M4, the fifth transistor M5 and the second storage capacitor C2.

The first electrode of the fourth transistor M4 herein is connected to the first potential terminal VGH, the second electrode of the fourth transistor M4 is connected to the second storage capacitor C2, and the gate of the fourth transistor M4 is connected to the fifth node P5. The fourth transistor M4 is configured to transmit the first potential Vgh of the first potential terminal VGH to the second storage capacitor C2 based on the potential of the fifth node P5.

The first electrode of the fifth transistor M5 is connected to the second clock signal terminal CLKB, the second electrode of the fifth transistor M5 is connected to the second storage capacitor C2, and the gate of the fifth transistor M5 is connected to the second node P2. The fifth transistor M5 is configured to write the second clock signal clkb at the second clock signal terminal CLKB to the second storage capacitor C2 based on the potential of the second node P2.

The first terminal of the second storage capacitor C2 is connected to the second electrode of the fourth transistor M4 and the second electrode of the fifth transistor M5, and the second terminal of the second storage capacitor C2 is connected to the second node P2.

Figure 2:
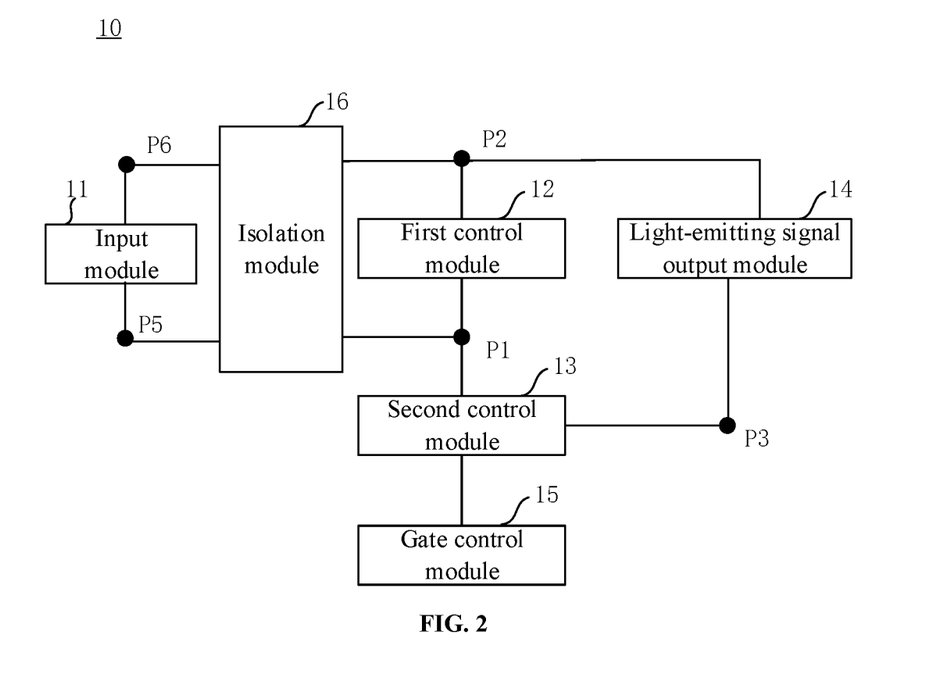
FIG. 2 is another schematic diagram of modules of a shift register according to embodiments of the present application.

With reference to FIGS. 2 and 4, in some embodiments, the shift register 10 further includes an isolation module 16, and the isolation module 16 includes a first isolation transistor M15 for isolating the fifth node P5 from the first node P1 and a second isolation transistor M16 for isolating the sixth node P6 from the second node P2.

Specifically, the first electrode of the first isolation transistor M15 is connected to the fifth node P5, the second electrode of the first isolation transistor M15 is connected to the first node P1, and the gate of the first isolation transistor M15 is connected to the second potential terminal VGL.

The first electrode of the second isolation transistor M16 is connected to the sixth node P6, the second electrode of the first isolation transistor M15 is connected to the second node P2, and the gate of the second isolation transistor M16 is connected to the second potential terminal VGL.

In further conjunction with FIG. 3 or FIG. 4, in some embodiments, the second control module 13 includes a sixth transistor M6, a seventh transistor M7, an eighth transistor M8, a third storage capacitor C3, and a fourth storage capacitor C4.

The first electrode of the sixth transistor M6 is connected to the second clock signal terminal CLKB, the second electrode of the sixth transistor M6 is connected to the fourth node P4, and the gate of the sixth transistor M6 is connected to the first node P1. The sixth transistor M6 is configured to write the second clock signal clkb at the second clock signal terminal CLKB to the fourth node P4 based on the potential of the first node P1.

The first electrode of the seventh transistor M7 is connected to the fourth node P4, the second electrode of the seventh transistor M7 is connected to the third node P3, and the gate of the seventh transistor M7 is connected to the second clock signal terminal CLKB. The seventh transistor M7 is configured to write the potential of the fourth node P4 to the third node P3 based on the second clock signal clkb at the second clock signal terminal CLKB.

The first electrode of the eighth transistor M8 is connected to the first potential terminal VGH, the second electrode of the eighth transistor M8 is connected to the third node P3, and the gate of the eighth transistor M8 is connected to the second node P2. The eighth transistor M8 is configured to write the first potential Vgh of the first potential terminal VGH to the third node P3 based on the potential of the second node P2.

The first terminal of the third storage capacitor C3 is connected to the third node P3, and the second terminal of the third storage capacitor C3 is connected to the first potential terminal VGH. The third storage capacitor C3 is configured to compensate the potential of the third node P3.

The first terminal of the fourth storage capacitor C4 is connected to the first node P1, and the second terminal of the fourth storage capacitor C4 is connected to the fourth node P4. The fourth storage capacitor C4 is configured to compensate the potential of the first node P1.

The gate control module 15 includes a first sub-gate control module 152, a second sub-gate control module 154 and a first output terminal Out1. The first sub-gate control module 152 is connected to the first potential terminal VGH, the signal input terminal IN and the first output terminal Out1, and is configured to transmit the first potential Vgh of the first potential terminal VGH to the first output terminal Out1 based on the input signal Input transmitted by the signal input terminal IN. The second sub-gate control module 154 is connected to the second control module 13, the first clock signal terminal CLK and the first output terminal Out1, and is configured to transmit the first clock signal clk of the first clock signal terminal CLK to the first output terminal Out1 based on the potential as input by the second control module 13.

Specifically, the first sub-gate control module 152 includes a first output control transistor M12, a first output transistor M14, and a first storage capacitor C1. The first electrode of the first output control transistor M12 is connected to the first potential terminal VGH, the second electrode of the first output control transistor M12 is connected to the first storage capacitor C1, and the gate of the first output control transistor M12 is connected to the signal input terminal IN. The first electrode of the first output transistor M14 is connected to the first potential terminal VGH, the second electrode of the first output transistor M14 is connected to the first output terminal Out1, and the gate of the first output control transistor M12 is connected to the signal input terminal IN.

The first terminal of the first storage capacitor C1 is connected to the second electrode of the first output control transistor M12, and the second terminal of the first storage capacitor C1 is connected to the first output terminal Out1.

The first output control transistor M12 is configured to write the first potential Vgh of the first potential terminal VGH to the first terminal of the first storage capacitor C1 based on the input signal Input at the signal input terminal IN. The first output transistor M14 is configured to write the first potential Vgh of the first potential terminal VGH to the first output terminal Out1 based on the input signal Input at the signal input terminal IN. The first storage capacitor C1 is configured to compensate the potential of the first output terminal Out1.

The second sub-gate control module 154 includes a second output control transistor M13 and a second output transistor M11. Both the first electrode and the gate of the second output control transistor M13 herein are connected to the second control module 13, and the second electrode of the second output control transistor M13 is connected to the first storage capacitor C1 and the second output transistor M11. The first electrode of the second output transistor M11 is connected to the first clock signal terminal CLK, the second electrode of the second output transistor M11 is connected to the first output terminal Out1, and the gate of the first output transistor M14 is connected to the second electrode of the second output control transistor M13.

The second output control transistor M13 is configured to write the potential of the fourth node P4 to the first terminal of the first storage capacitor C1 and the gate of the second output transistor M11 based on the potential of the fourth node P4. The second output transistor M11 is configured to transmit the first clock signal clk of the first clock signal terminal CLK to the first output terminal Out1 based on the potential of the fourth node P4 transmitted by the second output control transistor M13.

The light-emitting signal output module 14 includes a third output transistor M10, a fourth output transistor M9, and a second output terminal Out2. Specifically, the first electrode of the third output transistor M10 is connected to the second potential terminal VGL, the second electrode of the third output transistor M10 is connected to the second output terminal Out2, and the gate of the third output transistor M10 is connected to the second node P2. The first electrode of the fourth output transistor M9 is connected to the first potential terminal VGH, the second electrode of the fourth output transistor M9 is connected to the second output terminal Out2, and the gate of the fourth output transistor M9 is connected to the third node P3.

The third output transistor M10 is configured to transmit the second potential Vgl of the second potential terminal VGL to the second output terminal Out2 based on the potential of the second node P2. The fourth output transistor M9 is configured to transmit the first potential Vgh of the first potential terminal VGH to the second output terminal Out2 based on the potential of the third node P3.

Embodiments of the present application further provide a control method for controlling the shift register 10 according to any one of the aforesaid embodiments. The method includes following steps S12 and S14.

In S12, the light-emitting signal output module is controlled to output a light-emitting control signal having a length of 3H after the input module receives a first H of the input signal having a length of 3H.

In S14, the gate control module is controlled to output a gate control signal having a length less than 1H after the input module receives a second H of the input signal having a length of 3H.

The operation process of the shift register 10 according to the present application includes an initial stage, an input stage and an output stage. In addition, the duration of the input signal Input is 3H, the duration of the high-level signal of the first clock signal clk and the second clock signal clkb is less than 2H, and the duration of the low-level signal is less than 1H.

Figure 5:
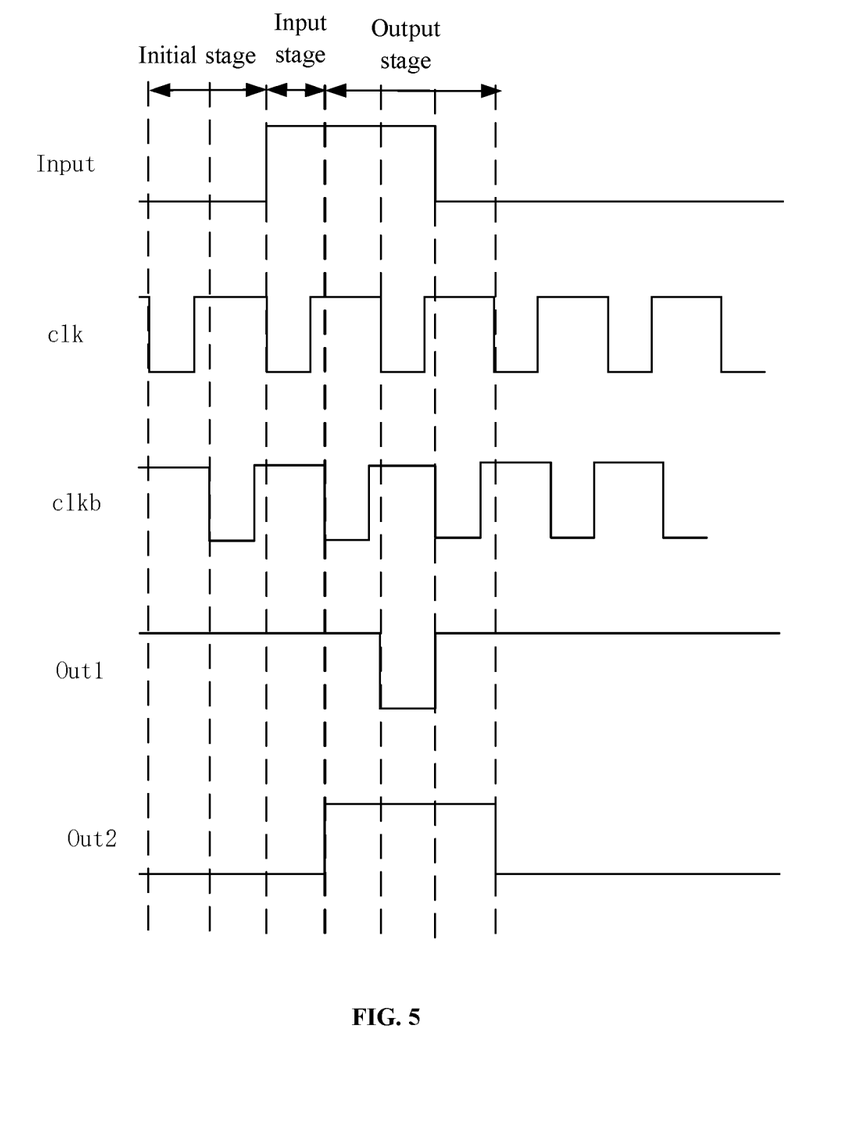
FIG. 5 is a time sequence diagram for a shift register according to embodiments of the present application.

The operation process of the shift register 10 will be illustrated below by taking the shift register in FIG. 3 and the time sequence diagram in FIG. 5 as an example.

In the initial stage, the input signal Input is a low-level signal, and the potential of the second node P2 is equal to or less than the second potential Vgl (low level) in size. The third output transistor M10 is turned on; the second potential terminal VGL and the second output terminal Out2 are turned on; the second potential Vgl is transmitted to the second output terminal Out2 via the third output transistor M10; and the second output terminal Out2 outputs the low level. Meanwhile, the first output control transistor M12 and the first output transistor M14 are turned on because the input signal Input is a low-level signal; the first potential terminal VGH is connected to the first storage capacitor C1 and the first output terminal Out1; the first potential Vgh of the first potential terminal VGH is transmitted to the first storage capacitor C1 and the first output terminal Out1; and the first output terminal Out1 outputs the high level.

In the input phase, the input signal Input at the signal input terminal IN is a high-level signal. The potential of the second node P2 is a high potential, and the third output transistor M10 is turned off. The first clock signal clk is a low-level signal; the second transistor M2 is turned on; the second potential terminal VGL is connected to the first node; the second potential Vgl of the second potential terminal VGL is written to the first node P1, such that the potential of the first node is a low level and the sixth transistor M6 is turned on; the first potential Vgh (high level) is written to the fourth node P4; the third node P3 maintains at the high level; the fourth output transistor M9 is turned off, and the second output terminal Out2 keeps outputting the low level. The second output control transistor M13 is disconnected; the input signal Input at the signal input terminal IN enables the first output control transistor M12 and the first output transistor M14 to be turned on; and the first output terminal Out1 maintains at the high level.

The output stage includes a first output sub-stage, a second output sub-stage and a third output sub-stage.

During the first output sub-stage, the input signal Input as input at the signal input terminal IN is a high-level signal; the second clock signal clkb is a low-level signal; the first clock signal clk is a high-level signal; the second transistor M2 is turned off, the first node maintains at the low level; the sixth transistor M6 is turned on; the second clock signal clkb is written to the fourth node P4 and the third node P3; and the third node P3 and the fourth node P4 are both at the low level. The fourth output transistor M9 is turned on, the second output terminal Out2 is connected to the first potential terminal VGH, and the first potential Vgh of the first potential terminal VGH is written to the second output terminal Out2. The first output terminal Out1 maintains at the high level. Meanwhile, the second output control transistor M13 is turned on; the potential of the third node P3 is written to the gate of the second output transistor M11; the second output transistor M11 is turned on; the first clock signal terminal CLK is connected to the first output terminal Out1; and the potential of the first output terminal Out1 is the first clock signal clk (high level).

During the second output sub-stage, the input signal Input is a high-level signal; the first clock signal clk is a low-level signal; the second clock signal clkb is a high-level signal; the second transistor M2 is turned off, the first node P1 maintains at the low level, such that the sixth transistor M6 remains on; the second clock signal clkb is written to the fourth node P4; the second output control transistor M13 and the seventh transistor are turned off, the third node P3 maintains at the low level; the fourth output transistor M9 is turned on; the second output terminal Out2 is connected to the first potential terminal VGH; the first potential Vgh of the first potential terminal VGH is written to the second output terminal Out2; and the second output terminal Out2 maintains at the high level. Meanwhile, the first output control transistor M12 and the first output transistor 14 are turned off because the input signal Input is a high-level signal; the first terminal of the first storage capacitor C1 maintains at the low level because the second output control transistor M13 is turned off, the second output transistor M11 is turned on based on the potential of the first storage capacitor C1 at the first terminal; the first clock signal terminal CLK is connected to the first output terminal OUT1; the first clock signal terminal CLK outputs the first clock signal clk (low level) to the first output terminal Out1 via the second output transistor M11; and the first output terminal Out1 outputs the low level.

During the third output sub-stage, the input signal Input is a low-level signal; the first clock signal clk becomes a high-level signal; the second clock signal clkb becomes a low-level signal; the second transistor M2 is turned off, the first node maintains at the low level, such that the sixth transistor M6 and the seventh transistor are both turned on; and the second clock signal clkb is written to the fourth node P4 and the third node P3. The fourth output transistor M9 is turned on; the first potential terminal VGH is connected to the second output terminal Out2; the first potential Vgh is written to the second output terminal Out2; and the second output terminal Out2 outputs the high level. Meanwhile, the second output control transistor M13 is turned on; the first output control transistor M12 and the first output transistor M14 are turned on based on the low-level signal at the signal input terminal IN; the first output terminal Out1 is connected to the first potential terminal VGH; the first potential Vgh is written to the first output terminal Out1; and the first output terminal Out1 outputs the high level.

The operation process of the shift register 10 will be illustrated below by taking the shift register in FIG. 4 and the time sequence diagram in FIG. 5 as an example.

In the initial stage, the input signal Input is a low-level signal, and the potential of the second node P2, under the action of the low-level signal and the second storage capacitor C2, is equal to or less than the second potential Vgl (low level) in size. The third output transistor M10 is turned on; the second potential terminal VGL and the second output terminal Out2 are turned on; the second potential Vgl is transmitted to the second output terminal Out2 via the third output transistor M10; and the second output terminal Out2 outputs the low level. Meanwhile, the first output control transistor M12 and the first output transistor M14 are turned on because the input signal Input is a low-level signal; the first potential terminal VGH is connected to the first storage capacitor C1 and the first output terminal Out1; the first potential Vgh of the first potential terminal VGH is transmitted to the first storage capacitor C1 and the first output terminal Out1; and the first output terminal Out1 outputs the high level.

In the input phase, the input signal Input is a high-level signal. The first clock signal clk is a low-level signal; the second clock signal is a high-level signal; the input signal Input is input to the sixth node P6 and the second node P2; the potential of the second node P2 is a high level; and the third output transistor M10 is turned off. The second transistor M2 and the second isolation transistor M16 are turned on; the second potential terminal VGL is connected to the fifth node P5 and the first node P1; the second potential Vgl of the second potential terminal VGL is written to the fifth node P5 and the first node P1, such that the potential of the fifth node P5 and the first node P1 is the low level; the sixth transistor M6 is turned on; the second clock signal (high level) is written to the fourth node P4; the third node P3 maintains at the high level; the fourth output transistor M9 is turned off, and the second output terminal Out2 keeps outputting the low level. The second output control transistor M13 is disconnected; the input signal Input at the signal input terminal IN enables the first output control transistor M12 and the first output transistor M14 to be turned on; and the first output terminal Out1 maintains at the high level.

The output stage includes a first output sub-stage, a second output sub-stage and a third output sub-stage.

During the first output sub-stage, the input signal Input as input at the signal input terminal IN is a high-level signal; the second clock signal clkb is a low-level signal; the first clock signal clk is a high-level signal; the second transistor M2 is turned off, the fifth node P5 and the first node P1 maintain at the low level; the sixth transistor M6 is turned on; the second clock signal clkb (low level) is written to the fourth node P4 and the third node P3; and the third node P3 and the fourth node P4 are both at the low level. The fourth output transistor M9 is turned on, the second output terminal Out2 is connected to the first potential terminal VGH, and the first potential Vgh of the first potential terminal VGH is written to the second output terminal Out2. The first output terminal Out1 outputs the high level. Meanwhile, the second output control transistor M13 is turned on; the potential of the third node P3 is written to the gate of the second output transistor M11; the second output transistor M11 is turned on; the first clock signal terminal CLK is connected to the first output terminal Out1; and the potential of the first output terminal Out1 is the first clock signal clk (high level).

During the second output sub-stage, the input signal Input is a high-level signal; the first clock signal clk is a low-level signal; the second clock signal clkb is a high-level signal; the second transistor M2 is turned off; the fifth node P5 and the first node P1 maintain at the low level, such that the sixth transistor M6 remains on; the second clock signal clkb is written to the fourth node P4; the second output control transistor M13 and the seventh transistor are turned off; the third node P3 maintains at the low level; the fourth output transistor M9 is turned on; the second output terminal Out2 is connected to the first potential terminal VGH; the first potential Vgh of the first potential terminal VGH is written to the second output terminal Out2; and the second output terminal Out2 outputs the high level. Meanwhile, the first output control transistor M12 and the first output transistor 14 are turned off because the input signal Input is a high-level signal; the first terminal of the first storage capacitor C1 maintains at the low level because the second output control transistor M13 is turned off; the second output transistor M11 is turned on based on the potential of the first storage capacitor C1 at the first terminal; the first clock signal terminal CLK is connected to the first output terminal OUT1; the first clock signal terminal CLK outputs the first clock signal clk (low level) to the first output terminal Out1 via the second output transistor M11; and the first output terminal Out1 outputs the low level.

During the third output sub-stage, the input signal Input is a low-level signal; the first clock signal clk becomes a high-level signal; the second clock signal clkb becomes a low-level signal; the second transistor M2 is turned off; the fifth node P5 and the first node P1 maintain at the low level, such that the sixth transistor M6 is turned on; the seventh transistor M7 is turned on; the second clock signal clkb is written to the fourth node P4 and the third node P3; the fourth output transistor M9 is turned on; the first potential VGH is connected to the second output terminal Out2; the first potential Vgh is written to the second output terminal Out2; and the second output terminal Out2 outputs the high level. Meanwhile, the second output control transistor M13 is turned on; the first output control transistor M12 and the first output transistor M14 are turned on based on the low-level signal at the signal input terminal IN; the first output terminal Out1 is connected to the first potential terminal VGH; the first potential Vgh is written to the first output terminal Out1; and the first output terminal Out1 outputs the high level.

Figure 6:
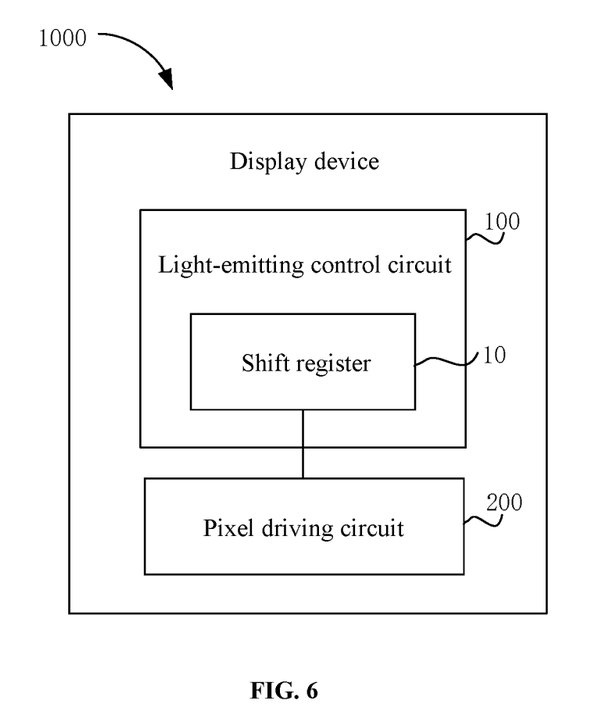
FIG. 6 is a schematic diagram of modules of a display device according to embodiments of the present application.

In conjunction with FIG. 6, embodiments of the present application also provide a light-emitting control circuit 100. The light-emitting control circuit 100 includes a plurality of cascaded shift registers 10. The first-stage shift register 10 adopts the shift register 10 of FIG. 3 or FIG. 4 entirely. In the shift register 10 of other stages, the second output control transistor M13 may be connected to the fourth node P4 in the connection fashion in FIG. 3 or FIG. 4; or the second output control transistor M13 may be connected to the first output terminal Out1 of the shift register 10 of the previous stage, and the remaining connections are in the same fashion in FIG. 3 or FIG. 4.

In addition, in some embodiments, among the plurality of cascaded shift registers 10, the second output terminal Out2 of the shift register 10 at the current stage may be connected to the input module 11 of the shift register 10 at the next stage. As a result, the light-emitting control signal as output from the second output terminal Out2 of the shift register 10 at the current stage may serve as the input signal of the shift register 10 at the next stage.

Further in conjunction with FIG. 6, the present application also provides a display device 1000. The display device 1000 includes a pixel driving circuit 200 and a light-emitting control circuit 100 as described above. The shift register 10 is connected to the pixel driving circuit 200, and the shift register 10 is configured to transmit the gate control signal and the light-emitting control signal to the pixel driving circuit 200 after receiving the input signal.

In some embodiments, the pixel driving circuit 200 includes a light-emitting signal input terminal and a gate signal input terminal. The light-emitting signal input terminal is connected to the light-emitting signal output module, and the gate signal input terminal is connected to the gate control module. The light-emitting signal input terminal is configured to receive the light-emitting control signal output by the light-emitting signal output module, and the gate signal input terminal is configured to receive the gate control signal output by the gate signal output module.

The display device 1000 may be applied to any product or component having a display function such as a mobile phone, a tablet computer, a TV set, a display, a notebook computer, a digital photo frame, a navigator and the like.

In the description of this specification, the description with reference to terms such as "an embodiment", "some embodiments", "exemplary embodiments", "examples", "specific examples", or "some examples" and the like indicates that the specific feature, structure, material or characteristic described in conjunction with the embodiment or example is included in at least one embodiment or example of the present application. In this specification, the schematic representations of the aforesaid terms do not necessarily refer to the same embodiment or example. Moreover, the specific features, structures, materials or characteristics as described may be combined in any one or more embodiments or examples in a suitable manner.

Although the embodiments of the present application have been shown and illustrated, those of ordinary skill in the art may understand that various changes, amendments, substitutions and modifications can be made to these embodiments without departing from the principle and purpose of the present application, and the scope of the present application is defined by the claims and their equivalents.

The invention claimed is:

1. A shift register, comprising: an input module, a first control module, a second control module, a light-emitting signal output module, and a gate control module, wherein
   the input module is respectively connected to a first node and a second node, and is configured to receive an input signal and control potentials of the first node and the second node;
   the first control module is connected to the first node and the second node, and is configured to control the potential of the second node based on the potential of the first node;
   the second control module is connected to the first node, the third node and the gate control module, and is configured to control potentials of the first node and a third node, and to control the gate control module to output a gate control signal; and
   the light-emitting signal output module is respectively connected to the second node and the third node, and is configured to output a light-emitting control signal based on the potential of one of the second node and the third node.

2. The shift register according to claim 1, wherein the shift register is connected to a signal input terminal, and the gate control module comprises a first sub-gate control module, a second sub-gate control module and a first output terminal;
   the first sub-gate control module is respectively connected to a first potential terminal, the signal input terminal and the first output terminal, and is configured to transmit a first potential of the first potential terminal to the first output terminal based on an input signal transmitted by the signal input terminal; and
   the second sub-gate control module is respectively connected to the second control module, a first clock signal terminal and the first output terminal, and is configured to transmit a first clock signal of the first clock signal terminal to the first output terminal based on a potential input by the second control module.

3. The shift register according to claim 2, wherein the first sub-gate control module comprises a first output control transistor, a first output transistor, and a first storage capacitor, wherein
   a first electrode of the first output control transistor is connected to the first potential terminal, a second electrode of the first output control transistor is connected to the first storage capacitor, and a gate of the first output control transistor is connected to the signal input terminal;
   a first electrode of the first output transistor is connected to the first potential terminal, a second electrode of the first output transistor is connected to the first output terminal, and a gate of the first output control transistor is connected to the signal input terminal;
   a first terminal of the first storage capacitor is connected to the second electrode of the first output control transistor, and a second terminal of the first storage capacitor is connected to the first output terminal.

4. The shift register according to claim 3, wherein the second sub-gate control module comprises a second output control transistor and a second output transistor, wherein
   both a first electrode and a gate of the second output control transistor are connected to the second control module, and a second electrode of the second output control transistor is respectively connected to the first storage capacitor and the second output transistor; and a first electrode of the second output transistor is connected to the first clock signal terminal, a second electrode of the second output transistor is connected to the first output terminal, and a gate of the first output transistor is connected to the second electrode of the second output control transistor.

5. The shift register according to claim 1, wherein the light-emitting signal output module comprises a third output transistor, a fourth output transistor and a second output terminal, wherein a first electrode of the third output transistor is connected to a second potential terminal, a second electrode of the third output transistor is connected to the second output terminal, and a gate of the third output transistor is connected to the second node; and a first electrode of the fourth output transistor is connected to a first potential terminal, a second electrode of the fourth output transistor is connected to the second output terminal, and a gate of the fourth output transistor is connected to the third node.

6. The shift register according to claim 1, wherein the shift register is connected to a signal input terminal, and the input module comprises a first transistor, a second transistor and a third transistor, wherein a first electrode of the first transistor is connected to the signal input terminal, a second electrode of the first transistor is connected to the second node, and a gate of the first transistor is connected to a first clock signal terminal;

a first electrode of the second transistor is connected to a second potential terminal, a second electrode of the second transistor is connected to the first node, and a gate of the second transistor is connected to the first clock signal terminal; and a first electrode of the third transistor is connected to a first clock signal, a second electrode of the third transistor is connected to the first node, and a gate of the third transistor is connected to the second node.

7. The shift register according to claim 6, wherein the input module further comprises:

a second storage capacitor, wherein a first terminal of the second storage capacitor is connected to a second clock signal terminal, and a second terminal of the second storage capacitor is connected to the second node.

8. The shift register according to claim 1, wherein the first control module comprises a fourth transistor and a fifth transistor;

a first electrode of the fourth transistor is connected to a first potential terminal, a second electrode of the fourth transistor is connected to the fifth transistor, and a gate of the fourth transistor is connected to the first node; and a first electrode of the fifth transistor is connected to the second electrode of the fourth transistor, a second electrode of the fifth transistor is connected to the second node, and a gate of the fifth transistor is connected to a second clock signal terminal.

9. The shift register according to claim 1, wherein the first control module comprises a fourth transistor, a fifth transistor and a second storage capacitor, wherein a first electrode of the fourth transistor is connected to a first potential terminal, a second electrode of the fourth transistor is connected to the second storage capacitor, and a gate of the fourth transistor is connected to a fifth node;

a first electrode of the fifth transistor is connected to a second clock signal terminal, a second electrode of the fifth transistor is connected to the second storage capacitor, and a gate of the fifth transistor is connected to the second node; and a first terminal of the second storage capacitor is respectively connected to the second electrode of the fourth transistor and the second electrode of the fifth transistor, and a second terminal of the second storage capacitor is connected to the second node.

10. The shift register according to claim 9, wherein the shift register further comprises an isolation module, and the isolation module comprises: a first isolation transistor for isolating the first node from the fifth node, and a second isolation transistor for isolating the second node from a sixth node;

a first electrode of the first isolation transistor is connected to the fifth node, a second electrode of the first isolation transistor is connected to the first node, and a gate of the first isolation transistor is connected to a second potential terminal; and a first electrode of the second isolation transistor is connected to the sixth node, a second electrode of the first isolation transistor is connected to the second node, and a gate of the second isolation transistor is connected to the second potential terminal.

11. The shift register according to claim 1, wherein the second control module comprises a sixth transistor, a seventh transistor, an eighth transistor, a third storage capacitor and a fourth storage capacitor, wherein a first electrode of the sixth transistor is connected to a second clock signal terminal, a second electrode of the sixth transistor is connected to a fourth node, and a gate of the sixth transistor is connected to the first node;

a first electrode of the seventh transistor is connected to the fourth node, a second electrode of the seventh transistor is connected to the third node, and a gate of the seventh transistor is connected to the second clock signal terminal;

a first electrode of the eighth transistor is connected to a first potential terminal, a second electrode of the eighth transistor is connected to the third node, and a gate of the eighth transistor is connected to the second node;

a first terminal of the third storage capacitor is connected to the third node, and a second terminal of the third storage capacitor is connected to the first potential terminal; and a first terminal of the fourth storage capacitor is connected to the first node, and a second terminal of the fourth storage capacitor is connected to the fourth node.

12. A light-emitting control circuit, comprising a plurality of cascaded shift registers, wherein each of the shift registers comprises: an input module, a first control module, a second control module, a light-emitting signal output module, and a gate control module, wherein the input module is respectively connected to a first node and a second node, and is configured to receive an input signal and control potentials of the first node and the second node;

the first control module is connected to the first node and the second node, and is configured to control the potential of the second node based on the potential of the first node;

the second control module is connected to the first node, the third node and the gate control module, and is configured to control potentials of the first node and a third node, and to control the gate control module to output a gate control signal; and the light-emitting signal output module is respectively connected to the second node and the third node, and is configured to output a light-emitting control signal based on the potential of one of the second node and the third node.

13. A display device, comprising a pixel driving circuit and a light-emitting control circuit which comprises a plurality of cascaded shift registers, wherein each of the shift registers comprises: an input module, a first control module, a second control module, a light-emitting signal output module, and a gate control module, the input module is respectively connected to a first node and a second node, and is configured to receive an input signal and control potentials of the first node and the second node;

the first control module is connected to the first node and the second node, and is configured to control the potential of the second node based on the potential of the first node;

the second control module is connected to the first node, the third node and the gate control module, and is configured to control potentials of the first node and a third node, and to control the gate control module to output a gate control signal; and the light-emitting signal output module is respectively connected to the second node and the third node, and is configured to output a light-emitting control signal based on the potential of one of the second node and the third node.

14. The display device according to claim 13, wherein the pixel driving circuit is connected to one of the shift registers, and the pixel driving circuit comprises a light-emitting signal input terminal and a gate signal input terminal; the light-emitting signal input terminal is connected to the light-emitting signal output module, and the gate signal input terminal is connected to the gate control module; and, the light-emitting signal input terminal is configured to receive the light-emitting control signal output by the light-emitting signal output module, and the gate signal input terminal is configured to receive the gate control signal output by the gate signal output module.

15. The display device according to claim 13, wherein each of the shift registers is connected to a signal input terminal, and the gate control module comprises a first sub-gate control module, a second sub-gate control module and a first output terminal;

the first sub-gate control module is respectively connected to a first potential terminal, the signal input terminal and the first output terminal, and is configured to transmit a first potential of the first potential terminal to the first output terminal based on an input signal transmitted by the signal input terminal; and the second sub-gate control module is respectively connected to the second control module, a first clock signal terminal and the first output terminal, and is configured to transmit a first clock signal of the first clock signal terminal to the first output terminal based on a potential input by the second control module.

16. The display device according to claim 15, wherein the first sub-gate control module comprises a first output control transistor, a first output transistor, and a first storage capacitor, wherein a first electrode of the first output control transistor is connected to the first potential terminal, a second electrode of the first output control transistor is connected to the first storage capacitor, and a gate of the first output control transistor is connected to the signal input terminal;

a first electrode of the first output transistor is connected to the first potential terminal, a second electrode of the first output transistor is connected to the first output terminal, and a gate of the first output control transistor is connected to the signal input terminal;

a first terminal of the first storage capacitor is connected to the second electrode of the first output control transistor, and a second terminal of the first storage capacitor is connected to the first output terminal.

17. The display device according to claim 16, wherein the second sub-gate control module comprises a second output control transistor and a second output transistor, wherein both a first electrode and a gate of the second output control transistor are connected to the second control module, and a second electrode of the second output control transistor is respectively connected to the first storage capacitor and the second output transistor; and a first electrode of the second output transistor is connected to the first clock signal terminal, a second electrode of the second output transistor is connected to the first output terminal, and a gate of the first output transistor is connected to the second electrode of the second output control transistor.

18. The display device according to claim 13, wherein the light-emitting signal output module comprises a third output transistor, a fourth output transistor and a second output terminal, wherein a first electrode of the third output transistor is connected to a second potential terminal, a second electrode of the third output transistor is connected to the second output terminal, and a gate of the third output transistor is connected to the second node; and a first electrode of the fourth output transistor is connected to a first potential terminal, a second electrode of the fourth output transistor is connected to the second output terminal, and a gate of the fourth output transistor is connected to the third node.

19. The display device according to claim 13, wherein each of the shift registers is connected to a signal input terminal, and the input module comprises a first transistor, a second transistor and a third transistor, wherein a first electrode of the first transistor is connected to the signal input terminal, a second electrode of the first transistor is connected to the second node, and a gate of the first transistor is connected to a first clock signal terminal;

a first electrode of the second transistor is connected to a second potential terminal, a second electrode of the second transistor is connected to the first node, and a gate of the second transistor is connected to the first clock signal terminal; and a first electrode of the third transistor is connected to a first clock signal, a second electrode of the third transistor is connected to the first node, and a gate of the third transistor is connected to the second node.

20. The display device according to claim 19, wherein the input module further comprises:

a second storage capacitor, wherein a first terminal of the second storage capacitor is connected to a second clock signal terminal, and a second terminal of the second storage capacitor is connected to the second node.

* * * * *